(12) United States Patent
Hashemi et al.

(10) Patent No.: US 12,402,342 B2
(45) Date of Patent: Aug. 26, 2025

(54) NANOSHEET DEVICE WITH T-SHAPED DUAL INNER SPACER

(71) Applicant: INTERNATIONAL BUSINESS MACHINES CORPORATION, Armonk, NY (US)

(72) Inventors: Pouya Hashemi, Purchase, NY (US); Alexander Reznicek, Troy, NY (US); Takashi Ando, Eastchester, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 740 days.

(21) Appl. No.: 17/551,463

(22) Filed: Dec. 15, 2021

(65) Prior Publication Data

US 2023/0187532 A1 Jun. 15, 2023

(51) Int. Cl.
*H10D 30/01* (2025.01)
*H01L 21/02* (2006.01)
*H10D 30/67* (2025.01)
*H10D 62/10* (2025.01)
*H10D 64/01* (2025.01)
(Continued)

(52) U.S. Cl.
CPC ... *H10D 30/0195* (2025.01); *H01L 21/02532* (2013.01); *H10D 30/024* (2025.01); *H10D 30/6735* (2025.01); *H10D 62/121* (2025.01); *H10D 64/017* (2025.01);
(Continued)

(58) Field of Classification Search
CPC ........ H01L 21/02518; H01L 21/02532; H10D 30/01; H10D 30/014; H10D 30/019–0198; H10D 30/0195; H10D 30/024; H10D 30/0273; H10D 30/0321; H10D 30/0323; H10D 30/0327; H10D 30/43; H10D 30/435; H10D 30/501–509; H10D 30/6735; H10D 30/674; H10D 30/6757; H10D 62/121; H10D 64/017; H10D 64/518; H10D 64/667; H10D 64/669; H10D 64/671;
(Continued)

(56) References Cited

U.S. PATENT DOCUMENTS 10,559,670 B2   2/2020   Guillorn et al.
10,651,291 B2   5/2020   Frougier et al.
(Continued)

OTHER PUBLICATIONS

International Search Report issued in corresponding PCT Application Serial No. PCT/EP2022/084053 dated Mar. 20, 2023, 4 pgs.
(Continued)

*Primary Examiner* — Cheung Lee
(74) *Attorney, Agent, or Firm* — Tutunjian & Bitetto, P.C.; Samuel Waldbaum

(57) ABSTRACT

A field effect device is provided. The field effect device includes a semiconductor nanosheet segment above a substrate, and a T-shaped inner spacer on the semiconductor nanosheet segment. The field effect device further includes a gate dielectric layer on the semiconductor nanosheet segment, and a first work function material plug on the gate dielectric layer. The field effect device further includes a second work function material layer on the first work function material plug and a center portion of the gate dielectric layer, wherein the second work function material layer is a different work function material from the first work function material plug.

20 Claims, 16 Drawing Sheets

(51) Int. Cl.
  *H10D 84/01* (2025.01)
  *H10D 84/03* (2025.01)
  *H10D 84/83* (2025.01)

(52) U.S. Cl.
  CPC ....... *H10D 84/0158* (2025.01); *H10D 84/038* (2025.01); *H10D 84/834* (2025.01)

(58) Field of Classification Search
  CPC .. H10D 64/675; H10D 84/01; H10D 84/0158; H10D 84/038; H10D 84/834
  See application file for complete search history.

(56) References Cited

U.S. PATENT DOCUMENTS

| | | |
|---|---|---|
| 10,971,585 B2 | 4/2021 | Lee et al. |
| 11,049,953 B2 | 6/2021 | Cheng et al. |
| 2019/0035941 A1 | 1/2019 | Oh et al. |
| 2020/0294866 A1 | 9/2020 | Cheng et al. |
| 2021/0202758 A1 | 7/2021 | Yeong et al. |
| 2021/0217846 A1 | 7/2021 | Hashemi et al. |

OTHER PUBLICATIONS

Hinkle et al. "Dipole Controlled Metal Gate with Hybrid Low Resistivity Cladding for Gate-Last CMOS with Low Vt", IEEE, Jun. 15, 2010, 2 pages.
Ramaswamy Nirmal J. "Electron Devices", International Meeting, Dec. 2, 2018, 316 pages.

NANOSHEET DEVICE WITH T-SHAPED DUAL INNER SPACER

BACKGROUND

The present invention generally relates to a nanosheet device with a dual inner spacer, and more particularly to a nanosheet device with a T-shaped inner spacer and two different work function materials in intimate contact with the channel.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows from a source to a drain. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a field effect device is provided. The field effect device includes a semiconductor nanosheet segment above a substrate, and a T-shaped inner spacer on the semiconductor nanosheet segment. The field effect device further includes a gate dielectric layer on the semiconductor nanosheet segment, and a first work function material plug on the gate dielectric layer. The field effect device further includes a second work function material layer on the first work function material plug and a center portion of the gate dielectric layer, wherein the second work function material layer is a different work function material from the first work function material plug.

In accordance with another embodiment of the present invention, a field effect device is provided. The field effect device includes a bottom isolation layer on a substrate, and a stack of semiconductor nanosheet segments over the bottom isolation layer. The field effect device further includes a T-shaped inner spacer between each of the semiconductor nanosheet segments. The field effect device further includes a gate dielectric layer on the T-shaped inner spacers and the semiconductor nanosheet segments, and a first work function material plug on the gate dielectric layer. The field effect device further includes a second work function material layer on the first work function material plug and a center portion of the gate dielectric layer, wherein the second work function material layer is a different work function material from the first work function material plug. The field effect device further includes a source/drain epitaxy adjoining each of the semiconductor nanosheet segments, wherein the T-shaped inner spacers separate the first work function material plugs from the source/drain epitaxy.

In accordance with yet another embodiment of the present invention, a method of forming a field effect device is provided. The method includes forming a stack of alternating semiconductor nanosheet segments and sacrificial nanosheet sections on a substrate, and removing a portion of the sacrificial nanosheet sections to form a sacrificial slab between each adjacent pair of semiconductor nanosheet segments. The method further includes forming an inner spacer template on opposite sides of each sacrificial slab, and forming an inner spacer on each inner spacer template. The method further includes removing the sacrificial slabs and inner spacer templates, and forming a first work function material plug in each cavity formed by the inner spacers and the semiconductor nanosheet segments.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a gate all around (GAA) structure on a stacked nanosheet (NS) device structure, where dual work function materials can provide both low-overlap capacitance (source/drain (S/D) and metal gate (MG)) and reduced gate induced drain leakage (GIDL) utilizing a "rotated T-shaped" inner spacer where the first work function material is within a cavity formed between the nanosheet device channel and the inner spacer, with no direct gating of the S/D and the second work function material is over the center of the NS device channel. Nanosheet parasitic capacitance formed between replacement metal gate (MG) and source/drain epitaxy can degrade the circuit delay.

Exemplary applications/uses to which the present invention can be applied include, but are not limited to: logic devices, including gates, and memory devices, including static random access memory (SRAM) and dynamic random access memory (DRAM).

It is to be understood that aspects of the present invention will be described in terms of a given illustrative architecture; however, other architectures, structures, substrate materials and process features and steps can be varied within the scope of aspects of the present invention.

Figure 1:
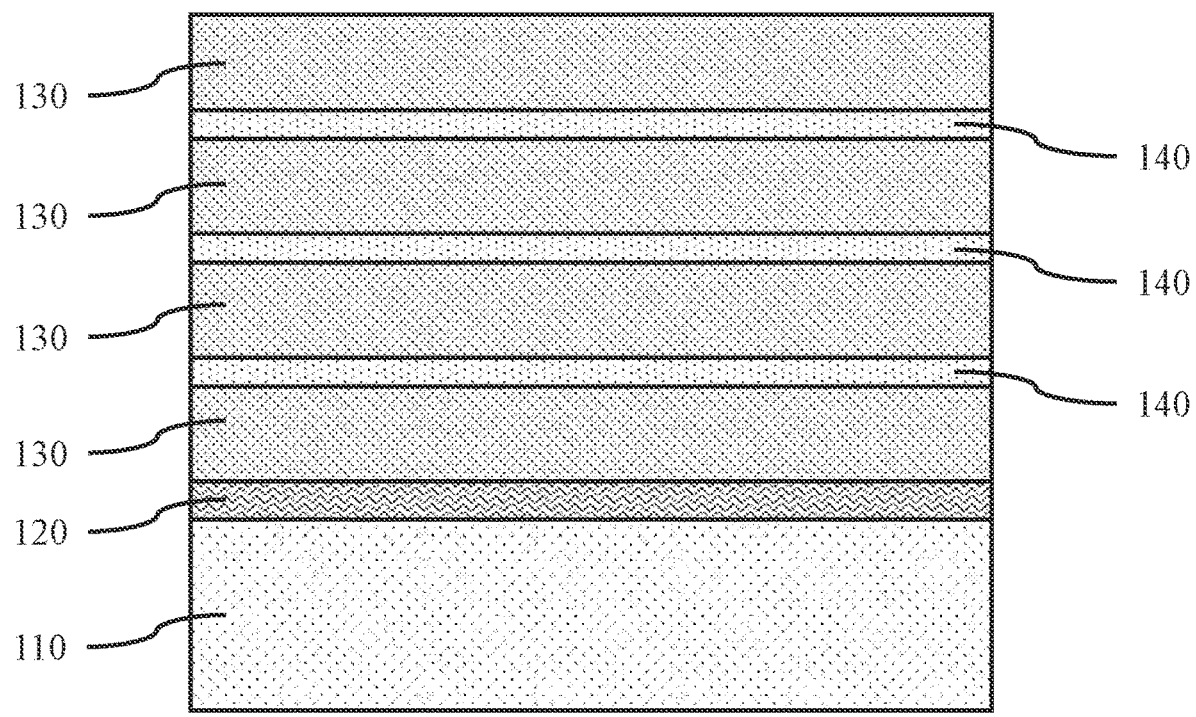
FIG. 1 is a cross-sectional side view showing a stack of alternating semiconductor nanosheets and sacrificial nanosheets on a bottom isolation layer and substrate, in accordance with an embodiment of the present invention.

Referring now to the drawings in which like numerals represent the same or similar elements and initially to FIG. 1, where FIG. 1 is a cross-sectional side view showing a stack of alternating semiconductor nanosheets and sacrificial nanosheets on a bottom isolation layer and substrate, in accordance with an embodiment of the present invention.

In one or more embodiments, a bottom isolation layer 120 can be formed on a substrate 110, where the bottom isolation layer 120 can be formed by replacing a bottom sacrificial layer between the stack and the substrate with an electrically insulating dielectric layer.

In various embodiments, the bottom isolation layer 120 can be an electrically insulating dielectric material, including, but not limited to, silicon oxide ($SiO_x$), silicon nitride ($Si_xN_y$), silicon oxynitride (SiON), silicon oxycarbide (SiOC), silicon boronitride (SiBN), silicon boro carbonitride (SiBCN), and combinations thereof.

In one or more embodiments, a stack of alternating semiconductor nanosheets 140 and sacrificial nanosheets 130 can be formed on the substrate 110, where the semiconductor nanosheets 140 and sacrificial nanosheets 130 can be formed by epitaxial growth from the substrate surface or from a bottom sacrificial layer on the substrate 110.

In various embodiments, the substrate 110 can be a semiconductor substrate made of, for example, a silicon (Si) or silicon-germanium (SiGe) semiconductor material.

In various embodiments, the semiconductor nanosheets 140 and sacrificial nanosheets 130 can be made of semiconductor materials that can be selectively removed relative to each other and the substrate 110, for example, the semiconductor nanosheets 140 can be silicon (Si) and sacrificial nanosheets 130 can be silicon-germanium (SiGe) with a suitable germanium concentration. The bottom isolation layer 120 can be formed by replacing a bottom sacrificial layer made of silicon-germanium (SiGe) having a higher germanium concentration than the sacrificial nanosheets 130.

In various embodiments, the sacrificial nanosheets 130 can have a thickness in a range of about 3 nanometers (nm) to about 12 nm, or about 5 nm to about 8 nm, although other thicknesses are also contemplated.

In various embodiments, the semiconductor nanosheets 140 can have a thickness in a range of about 3 nanometers (nm) to about 12 nm, or about 5 nm to about 8 nm, although other thicknesses are also contemplated.

Figure 2:
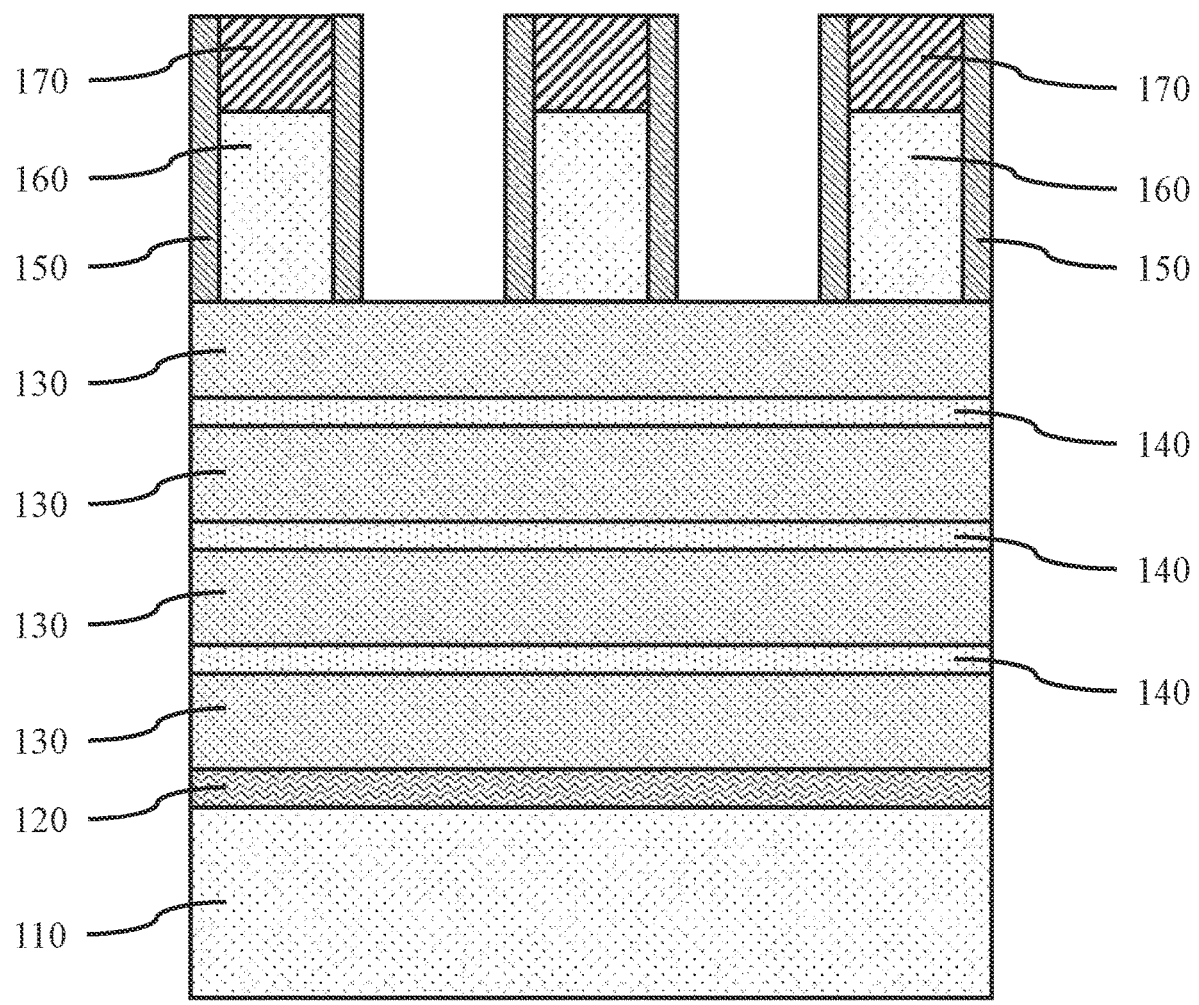
FIG. 2 is a cross-sectional side view showing a plurality of dummy gate structures formed on the stack of alternating semiconductor nanosheets and sacrificial nanosheets, in accordance with an embodiment of the present invention.

FIG. 2 is a cross-sectional side view showing a plurality of dummy gate structures formed on the stack of alternating semiconductor nanosheets and sacrificial nanosheets, in accordance with an embodiment of the present invention.

In one or more embodiments, one or more dummy gate structures can be formed on the stack of alternating semiconductor nanosheets 140 and sacrificial nanosheets 130. The dummy gate structures can include a dummy gate spacer 150, a dummy gate fill 160, and a dummy gate cap 170. The dummy gate fill 160 can be a material that can be selectively removed relative to the dummy gate spacer 150 and the sacrificial nanosheets 130, for example, amorphous carbon (a-C), amorphous silicon (a-Si), amorphous germanium (a-Ge), and combination thereof.

In various embodiments, the dummy gate spacer 150 can be an electrically insulating dielectric material, including, but not limited to, silicon oxide ($SiO_x$), silicon nitride ($Si_xN_y$), silicon oxynitride (SiON), silicon oxycarbide (SiOC), silicon boronitride (SiBN), silicon boro carbonitride (SiBCN), and combinations thereof.

In various embodiments, the dummy gate cap 170 can be an electrically insulating dielectric material, including, but not limited to, silicon oxide ($SiO_x$), silicon nitride ($Si_xN_y$), silicon oxynitride (SiON), silicon oxycarbide (SiOC), silicon boronitride (SiBN), silicon boro carbonitride (SiBCN), and combinations thereof.

Figure 3:
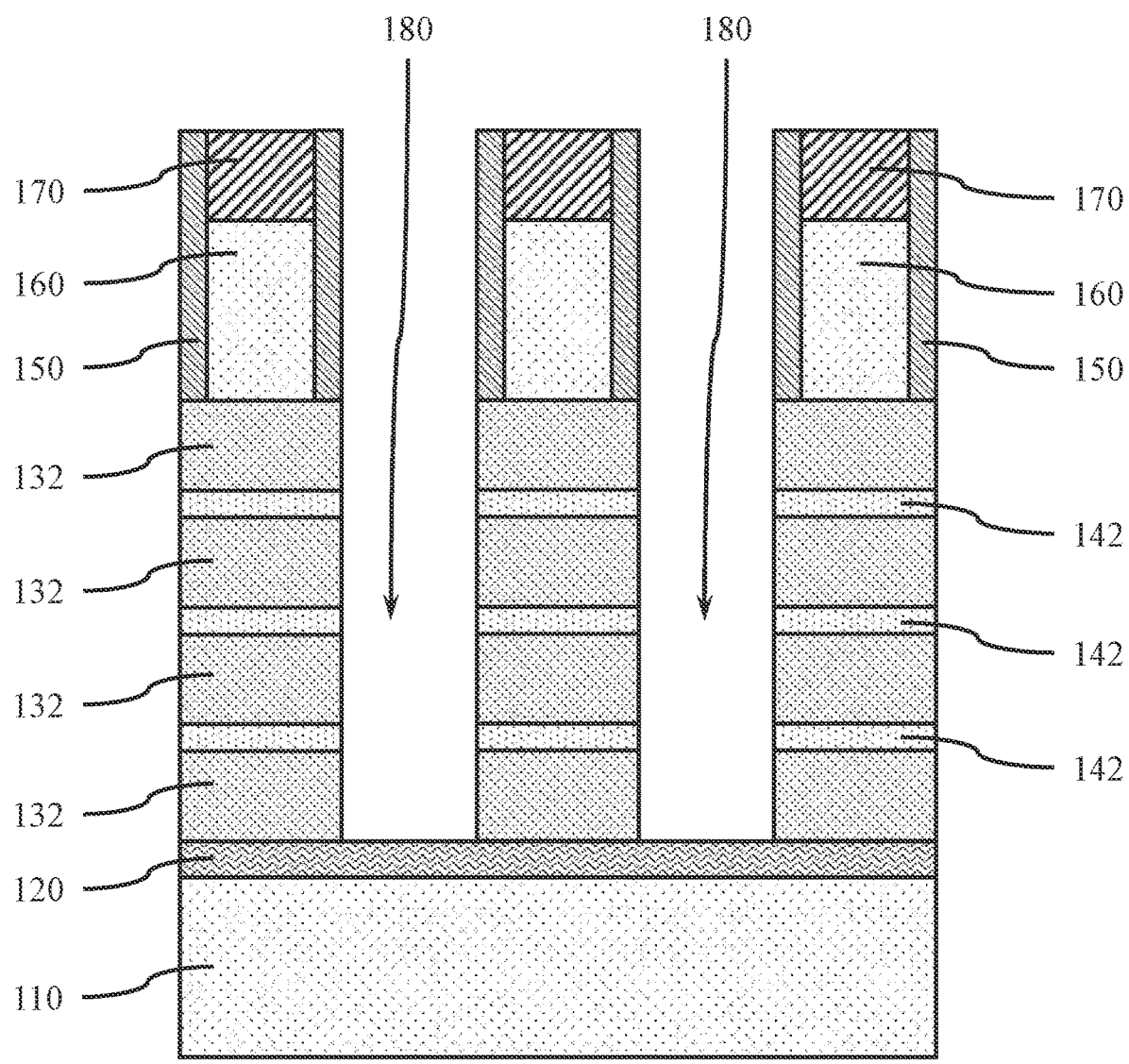
FIG. 3 is a cross-sectional side view showing portions of the stack of alternating semiconductor nanosheets and sacrificial nanosheets removed from between the dummy gate structures, in accordance with an embodiment of the present invention.

FIG. 3 is a cross-sectional side view showing portions of the stack of alternating semiconductor nanosheets and sacrificial nanosheets removed from between the dummy gate structures, in accordance with an embodiment of the present invention.

In one or more embodiments, a plurality of trenches 180 can be formed between the dummy gate structures by removing portions of the alternating semiconductor nanosheets 140 and sacrificial nanosheets 130, where the portions of the alternating semiconductor nanosheets 140 and sacrificial nanosheets 130 can be removed with a selective, directional etch, for example, a reactive ion etch (RIE). Removal of the portions of the alternating semiconductor nanosheets 140 and sacrificial nanosheets 130 can form stacks of alternating semiconductor nanosheet segments 142 and sacrificial nanosheet sections 132. Removal of the portions of the alternating semiconductor nanosheets 140 and sacrificial nanosheets 130 can expose the top surface of the underlying bottom isolation layer 120.

Figure 4:
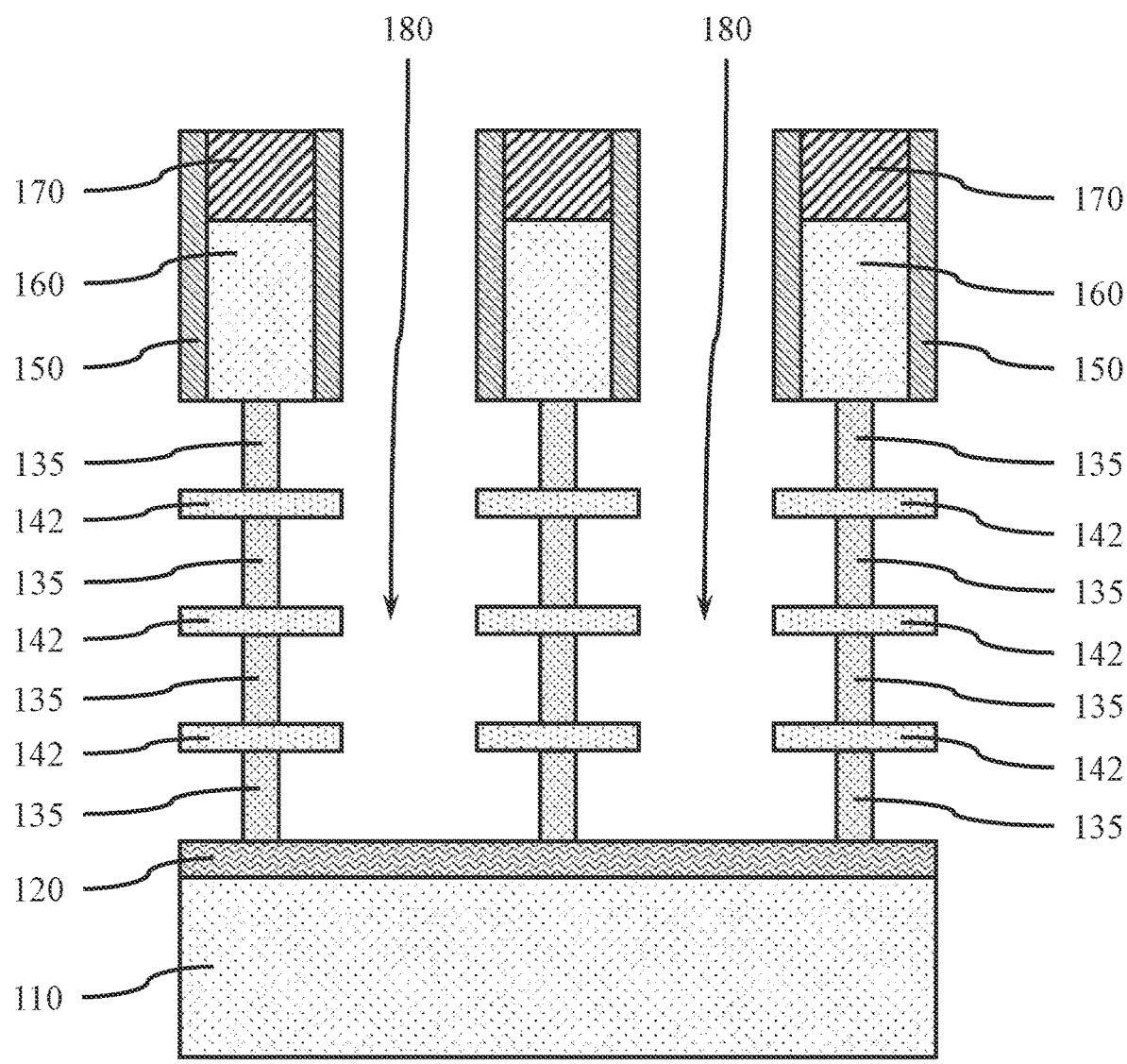
FIG. 4 is a cross-sectional side view showing removal of portions of the sacrificial nanosheet sections to form sacrificial slabs between the semiconductor nanosheet segments, in accordance with an embodiment of the present invention.

FIG. 4 is a cross-sectional side view showing removal of portions of the sacrificial nanosheet sections to form sacrificial slabs between the semiconductor nanosheet segments, in accordance with an embodiment of the present invention.

In one or more embodiments, a portion of each of the sacrificial nanosheet sections 132 can be removed, where the portions of the sacrificial nanosheet sections 132 can be removed using a selective, isotropic etch, for example, a wet chemical etch or dry plasma etch. Removal of the portions of the sacrificial nanosheet sections 132 can form sacrificial slabs 135 between the adjacent semiconductor nanosheet segments 142.

Figure 5:
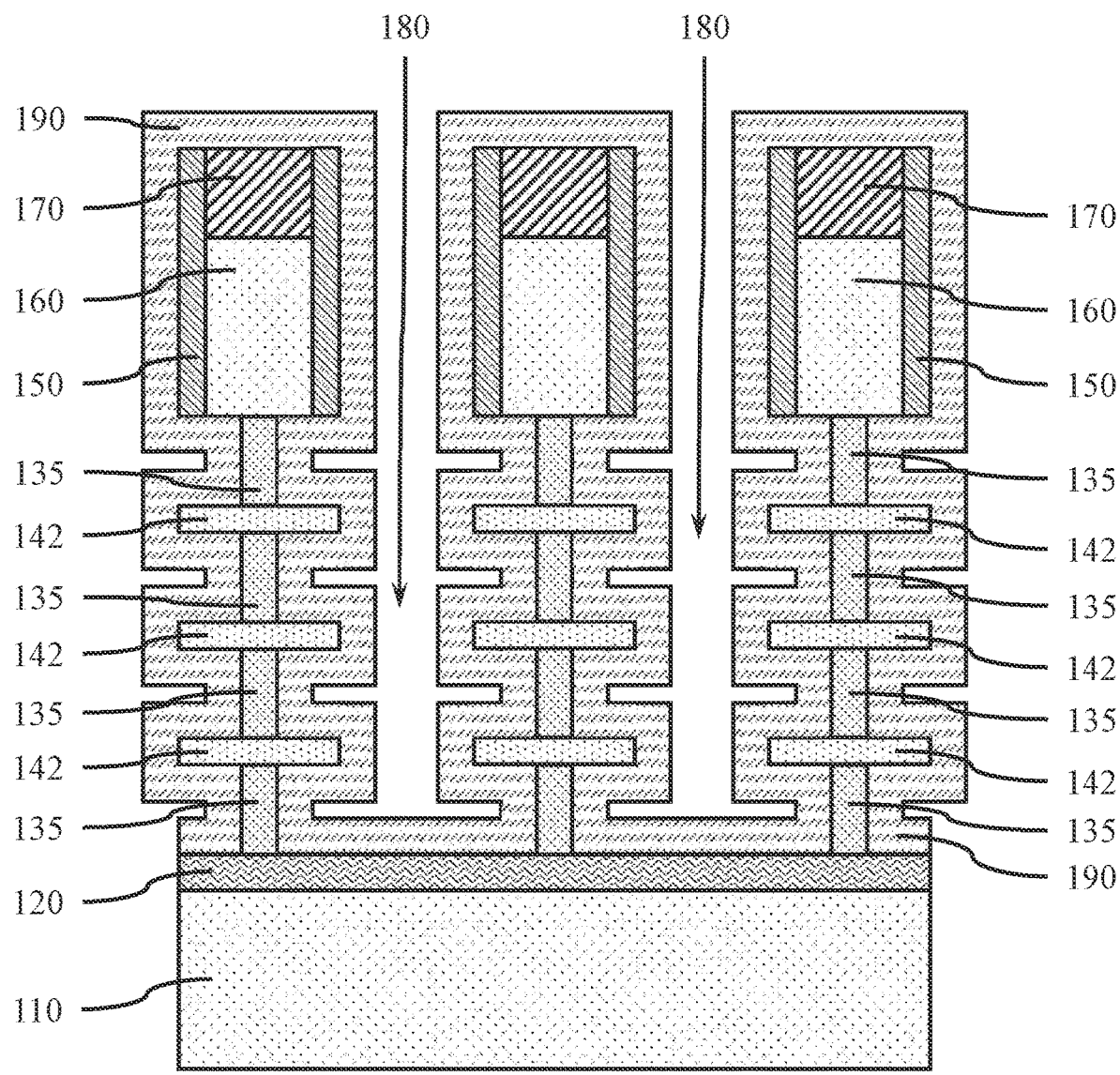
FIG. 5 is a cross-sectional side view showing formation of a dummy liner on the dummy gate structures, sacrificial slabs, semiconductor nanosheet segments, and bottom isolation layer, in accordance with an embodiment of the present invention.

FIG. 5 is a cross-sectional side view showing formation of a dummy liner on the dummy gate structures, sacrificial slabs, semiconductor nanosheet segments, and bottom isolation layer, in accordance with an embodiment of the present invention.

In one or more embodiments, a dummy liner 190 can be formed on the dummy gate structures, sacrificial slabs 135, semiconductor nanosheet segments 142, and bottom isolation layer 120. The dummy liner 190 can be formed by a conformal deposition, for example, atomic layer deposition (ALD), plasma enhanced ALD (PEALD), and combinations thereof.

In various embodiments, the dummy liner 190 can have a thickness in a range of about 1 nanometers (nm) to about 5 nm, or about 1 nm to about 3 nm, although other thicknesses are also contemplated. The thickness of the dummy liner 190 can be less than half the height of the sacrificial slabs 135, so the dummy liner 190 does not fill in or pinch off the space between the adjacent semiconductor nanosheet segments 142.

In various embodiments, the dummy liner 190 can be a dielectric material, including, but not limited to, silicon oxide ($SiO_x$), silicon nitride ($Si_xN_y$), silicon oxynitride (SiON), silicon oxycarbide (SiOC), silicon boronitride (SiBN), silicon boro carbonitride (SiBCN), and combinations thereof. The material of the dummy liner 190 can be a dielectric material that can be selectively etchable relative to the other exposed materials.

Figure 6:
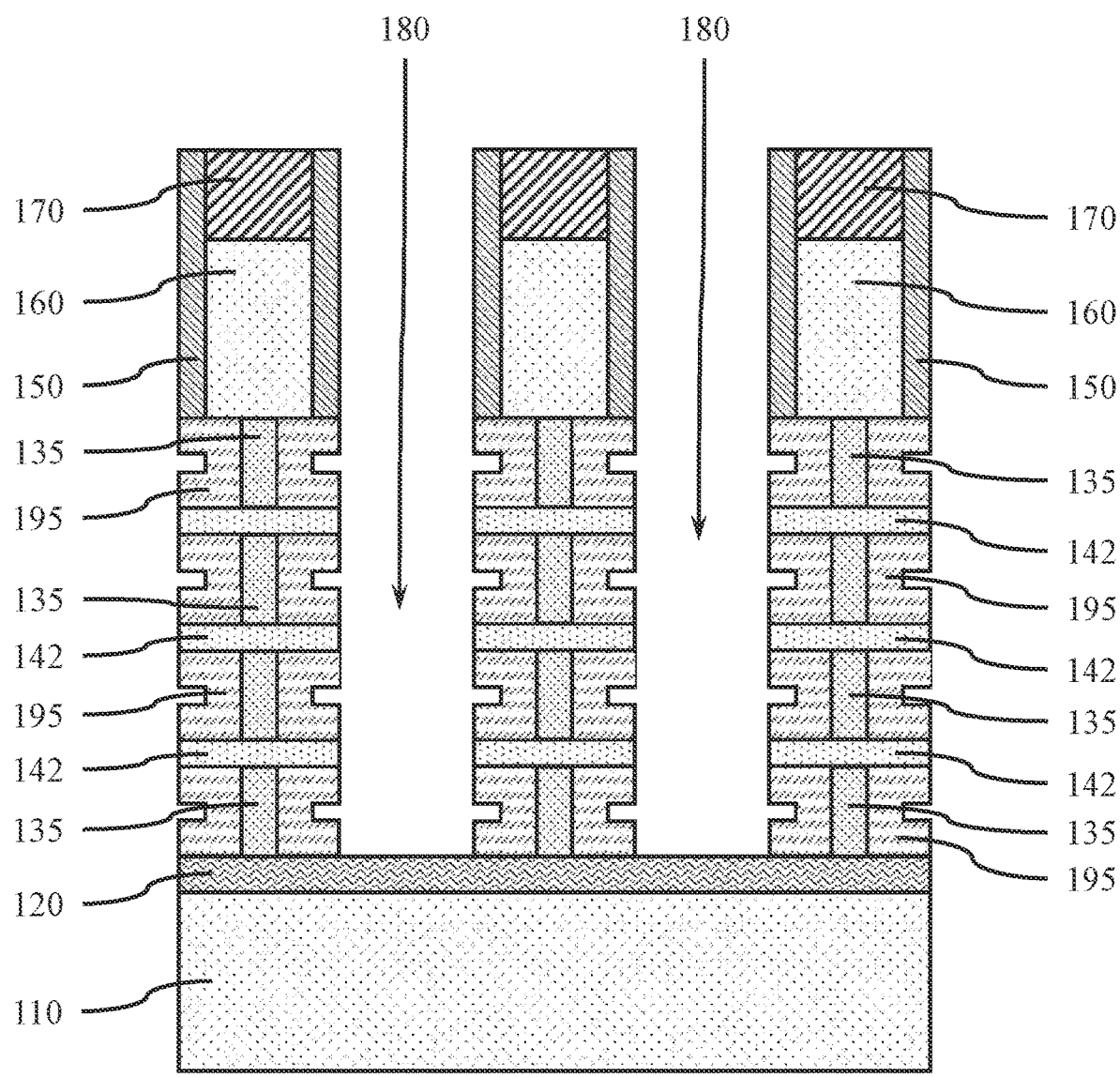
FIG. 6 is a cross-sectional side view showing removal of portions of the dummy liner from the dummy gate structures, semiconductor nanosheet segments, and bottom isolation layer to form dummy inner spacers on the sacrificial slabs, in accordance with an embodiment of the present invention.

FIG. 6 is a cross-sectional side view showing removal of portions of the dummy liner from the dummy gate structures, semiconductor nanosheet segments, and bottom isolation layer to form dummy inner spacers on the sacrificial slabs, in accordance with an embodiment of the present invention.

In one or more embodiments, portions of the dummy liner 190 can be removed from the dummy gate structures, semiconductor nanosheet segments 142, and bottom isolation layer 120 to form dummy inner spacers 195 on the sacrificial slabs 135. The portions of the dummy liner 190 can be removed using a selective, directional etch (e.g., RIE), that can leave the portions of the dummy liner 190 beneath the dummy gate spacer(s) 150 and the dummy gate cap 170, which can act as a mask for the etching.

Figure 7:
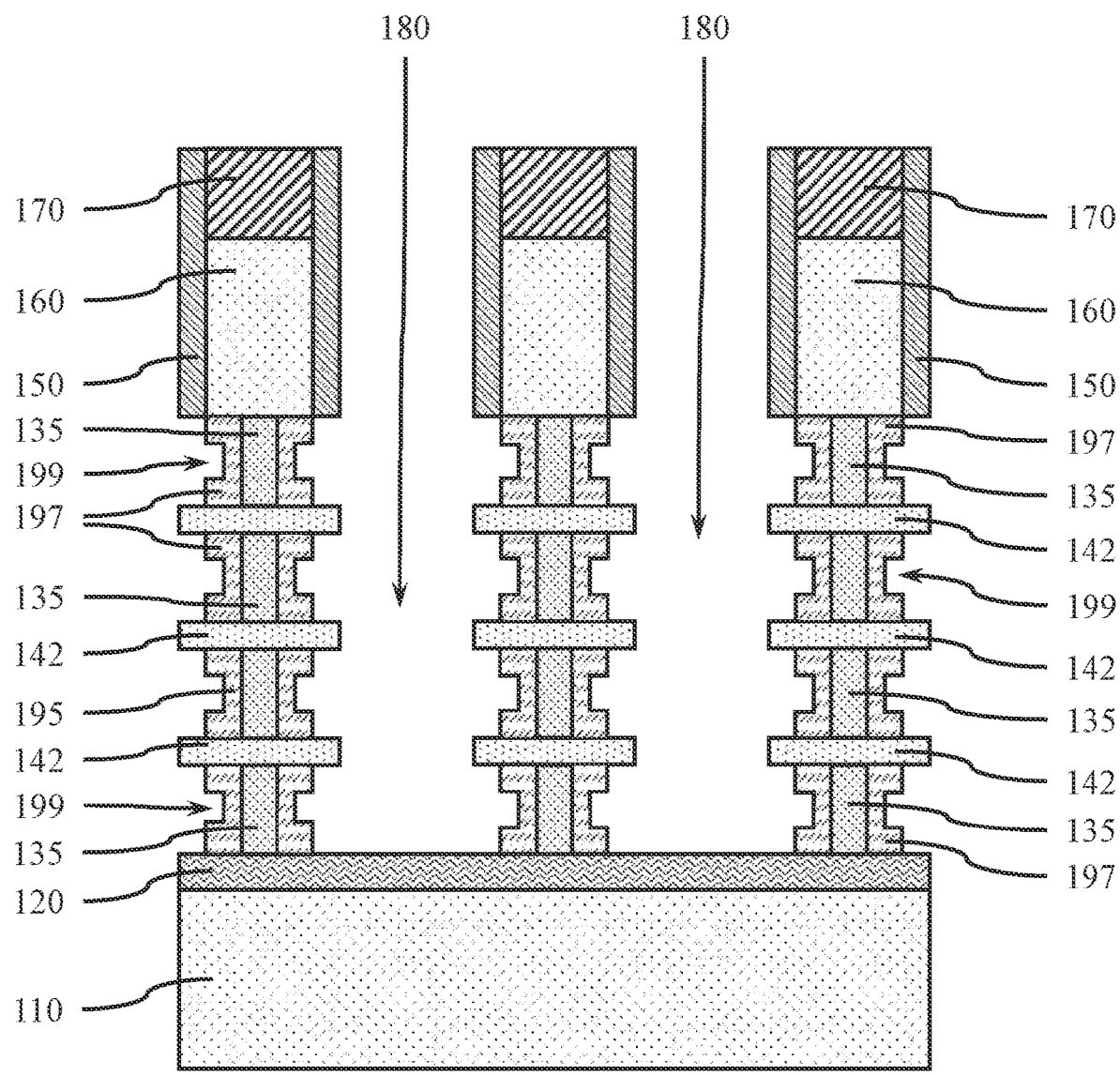
FIG. 7 is a cross-sectional side view showing recessing of the dummy inner spacers to form inner spacer templates, in accordance with an embodiment of the present invention.

FIG. 7 is a cross-sectional side view showing recessing of the dummy inner spacers to form inner spacer templates, in accordance with an embodiment of the present invention.

In one or more embodiments, the dummy inner spacers 195 can be recessed to form inner spacer templates 197, where the dummy inner spacers 195 can be recessed using a selective isotropic etch. The inner spacer templates 197 can be on opposite sides of each sacrificial slab 135. Removal of the portions of the dummy inner spacers 195 can expose end portions of the semiconductor nanosheet segments 142 and increase the size of the indentation 199 in the inner spacer templates 197.

In various embodiments, the indentation 199 in the inner spacer templates 197 can have a height in a range of about 2 nm to about 6 nm, or about 2 nm to about 4 nm, although other heights are also contemplated. In various embodiments, the height of the indentation 199 can be about one-third (⅓) the height of the sacrificial slab 135.

Figure 8:
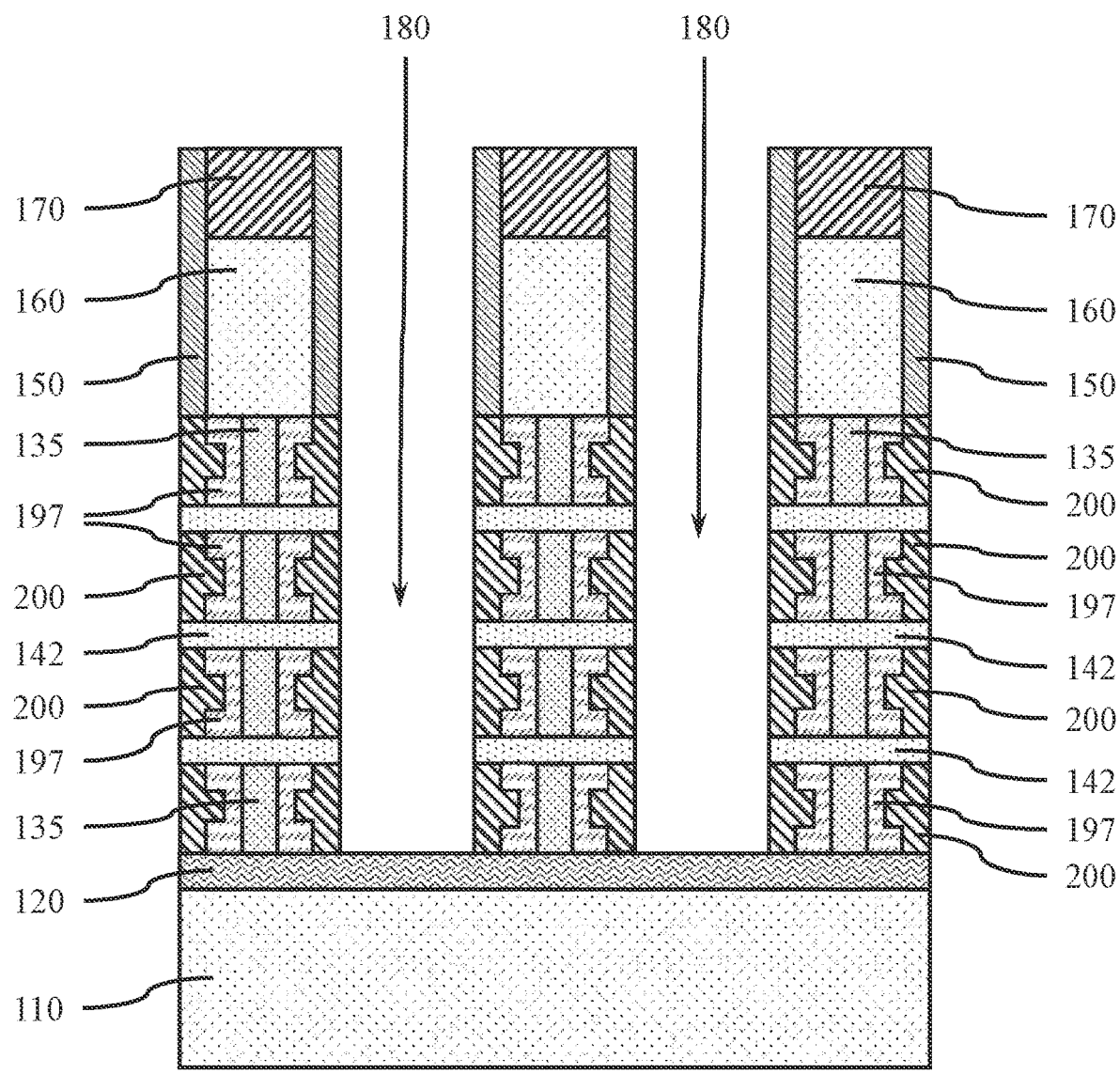
FIG. 8 is a cross-sectional side view showing formation of inner spacers on the inner spacer templates and semiconductor nanosheet segments, in accordance with an embodiment of the present invention.

FIG. 8 is a cross-sectional side view showing formation of inner spacers on the inner spacer templates and semiconductor nanosheet segments, in accordance with an embodiment of the present invention.

In one or more embodiments, inner spacers 200 can be formed on the inner spacer templates 197 and semiconductor nanosheet segments 142, where the inner spacers 200 can be formed by conformally depositing an inner spacer layer on the exposed surfaces, and removing portions of the inner spacer layer with a selective, directional etch. The inner spacers 200 can have a "T" shape by filling in the indentation 199 of the inner spacer templates 197.

In various embodiments, the inner spacers 200 can be an electrically insulating dielectric material, including, but not limited to, silicon oxide ($SiO_x$), silicon nitride ($Si_xN_y$), silicon oxynitride (SiON), silicon oxycarbide (SiOC), silicon boronitride (SiBN), silicon boro carbonitride (SiBCN), and combinations thereof.

Figure 9:
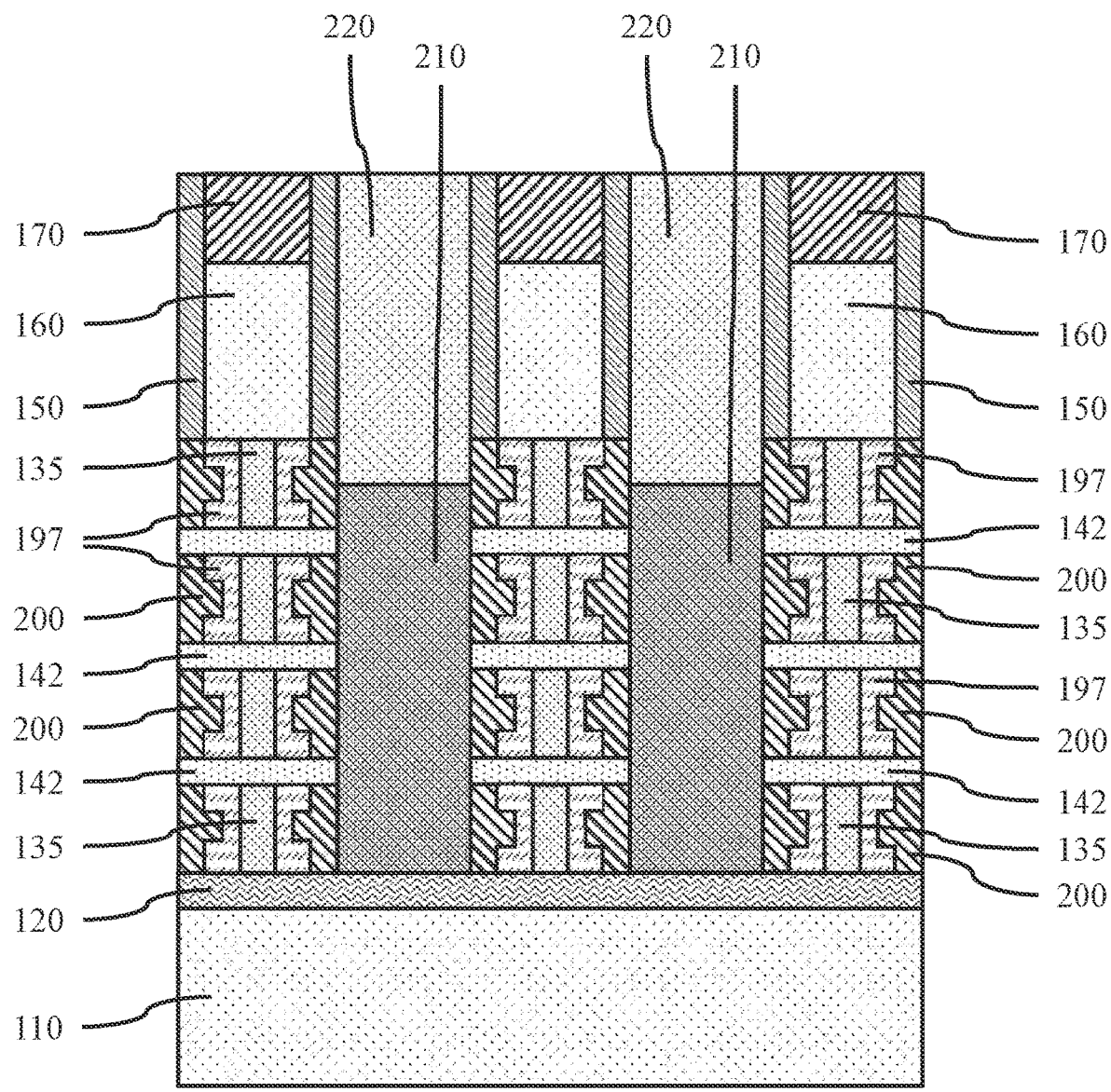
FIG. 9 is a cross-sectional side view showing formation of source/drain epitaxy on the semiconductor nanosheet segments and bottom isolation layer, in accordance with an embodiment of the present invention.

FIG. 9 is a cross-sectional side view showing formation of source/drain epitaxy on the semiconductor nanosheet segments and bottom isolation layer, in accordance with an embodiment of the present invention.

In one or more embodiments, source/drain epitaxy 210 can be formed on the semiconductor nanosheet segments 142 and bottom isolation layer 120, where the source/drain epitaxy 210 can be formed by lateral epitaxial growth from the exposed surfaces of the semiconductor nanosheet segments 142. The source/drain epitaxy 210 can cover the sidewalls of the inner spacers 200. A top surface of the source/drain epitaxy 210 can be above the upper-most semiconductor nanosheet segments 142 and below the dummy gate structure.

In various embodiments, a source/drain epitaxy cap 220 can be formed on each source/drain epitaxy 210. The source/drain epitaxy cap 220 can fill in the space between the adjacent dummy gate spacers 150.

In various embodiments, the source/drain epitaxy cap 220 can be an electrically insulating dielectric material, including, but not limited to, silicon oxide ($SiO_x$), silicon nitride ($Si_xN_y$), silicon oxynitride (SiON), silicon oxycarbide (SiOC), silicon boronitride (SiBN), silicon boro carbonitride (SiBCN), and combinations thereof.

Figure 10:
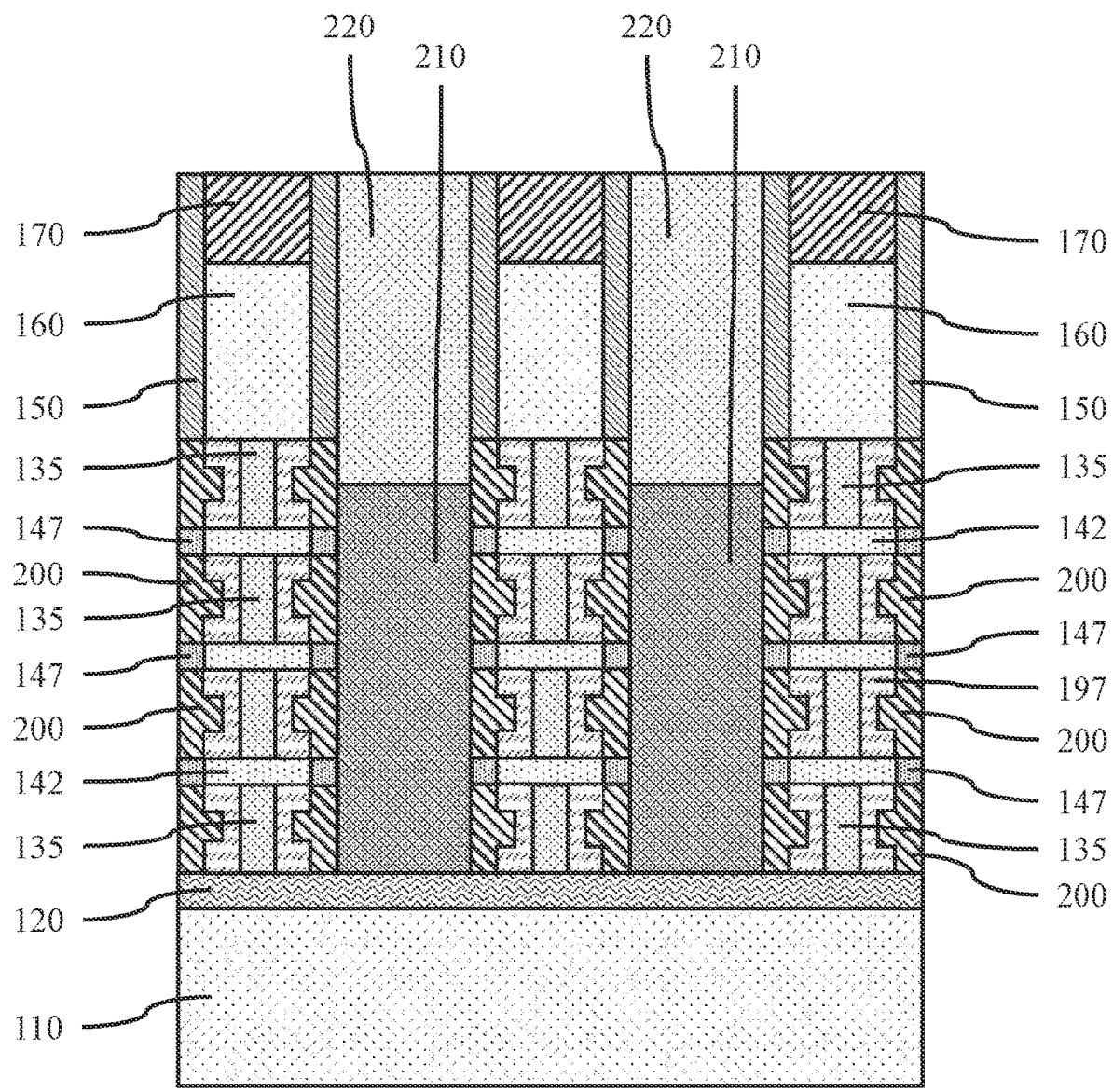
FIG. 10 is a cross-sectional side view showing formation of junction regions in the portions of the semiconductor nanosheet segments adjoining the source/drain epitaxy, in accordance with an embodiment of the present invention.

FIG. 10 is a cross-sectional side view showing formation of junction regions in the portions of the semiconductor nanosheet segments adjoining the source/drain epitaxy, in accordance with an embodiment of the present invention.

In one or more embodiments, junction regions 147 can be formed in the portions of the semiconductor nanosheet segments 142 adjoining the source/drain epitaxy 210, where the junction regions 147 can be formed by diffusing dopants from the source/drain epitaxy 210 into the semiconductor nanosheet segments 142 using a heat treatment process, for example, a rapid thermal anneal (RTA).

In various embodiments, the junction regions 147 can have a dopant concentration in a range of about $1 \times 10^{17}$ atoms/cm$^3$ to about $5 \times 10^{19}$ atoms/cm$^3$, although other dopant concentrations are also contemplated.

Figure 11:
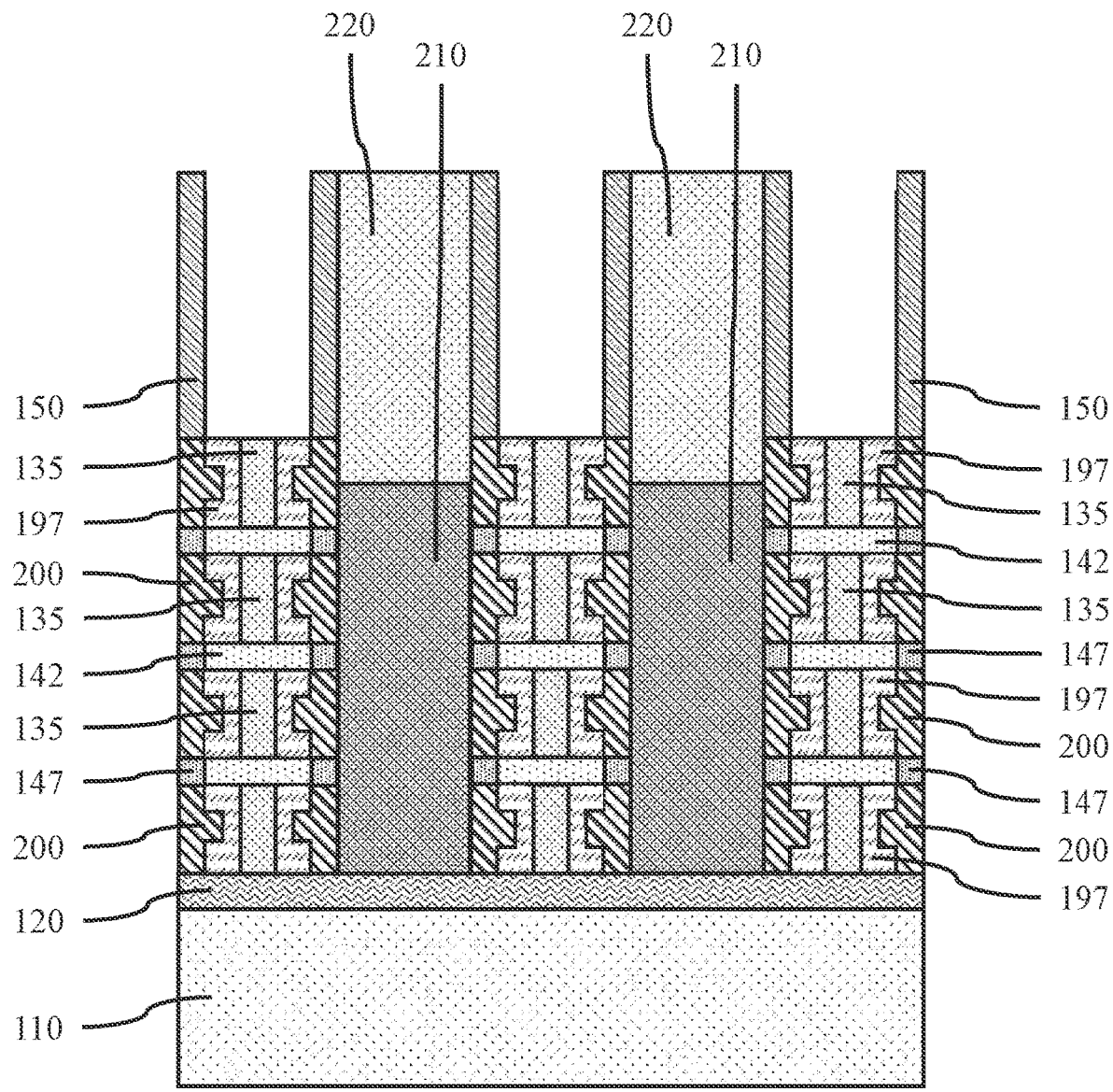
FIG. 11 is a cross-sectional side view showing removal of the dummy gate from between the dummy gate spacers, in accordance with an embodiment of the present invention.

FIG. 11 is a cross-sectional side view showing removal of the dummy gate from between the dummy gate spacers, in accordance with an embodiment of the present invention.

In one or more embodiments, the dummy gate cap 170 and dummy gate fill 160 forming the dummy gate can be removed using selective etching (e.g., RIE, isotropic etching). Removal of the dummy gate cap 170 and dummy gate fill 160 can expose a top surface of an underlying sacrificial slab 135 and inner spacer template 197. The inner spacers 200 can be beneath the dummy gate spacer 150.

Figure 12:
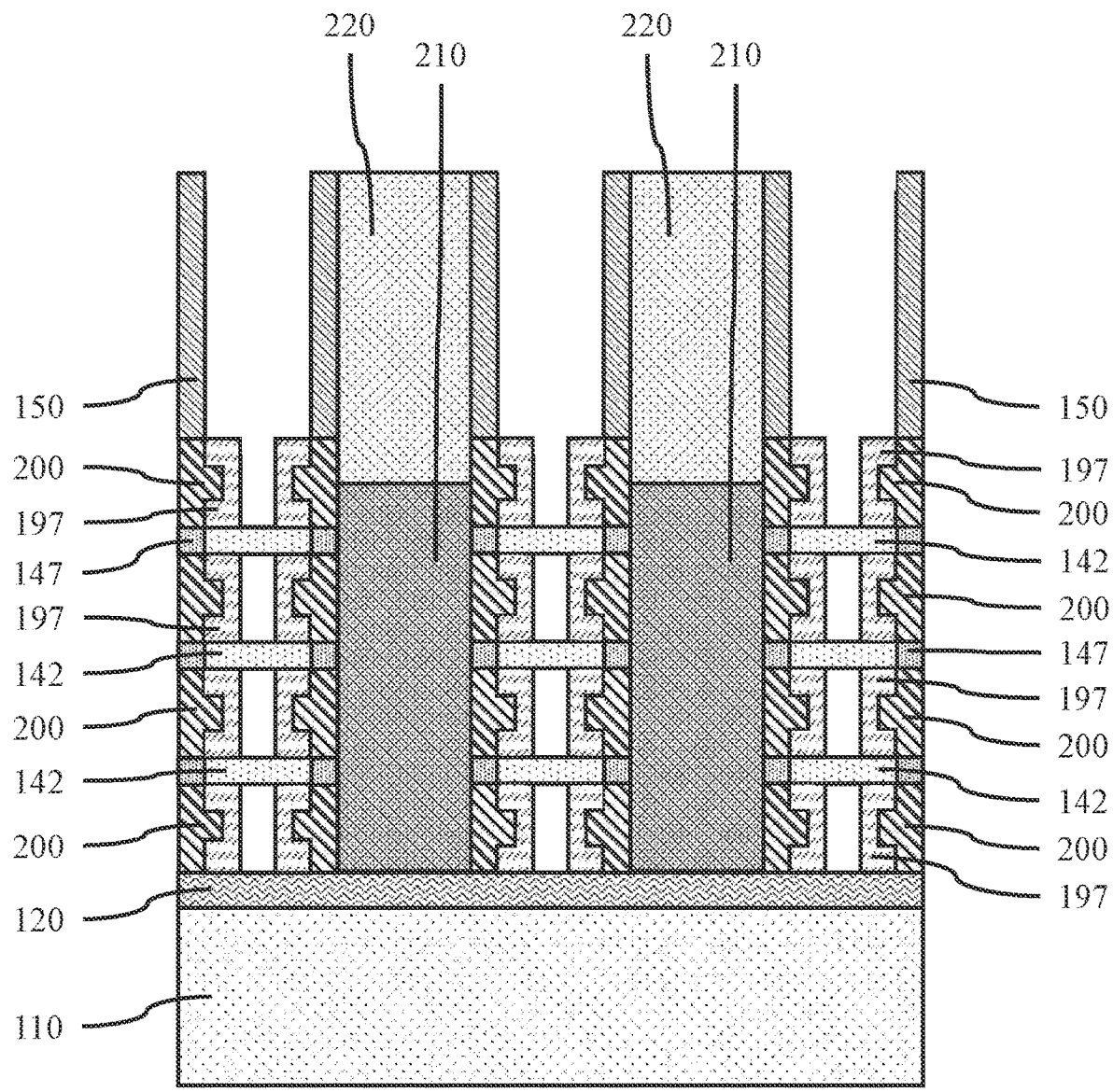
FIG. 12 is a cross-sectional side view showing removal of the sacrificial slabs from between the inner spacer templates, in accordance with an embodiment of the present invention.

FIG. 12 is a cross-sectional side view showing removal of the sacrificial slabs from between the inner spacer templates, in accordance with an embodiment of the present invention.

In one or more embodiments, the sacrificial slabs 135 can be removed from between the inner spacer templates 197 using a selective isotropic etch. An access trench may be formed along a side surface of the sacrificial slabs 135 to allow access for the selective isotropic etch.

Figure 13:
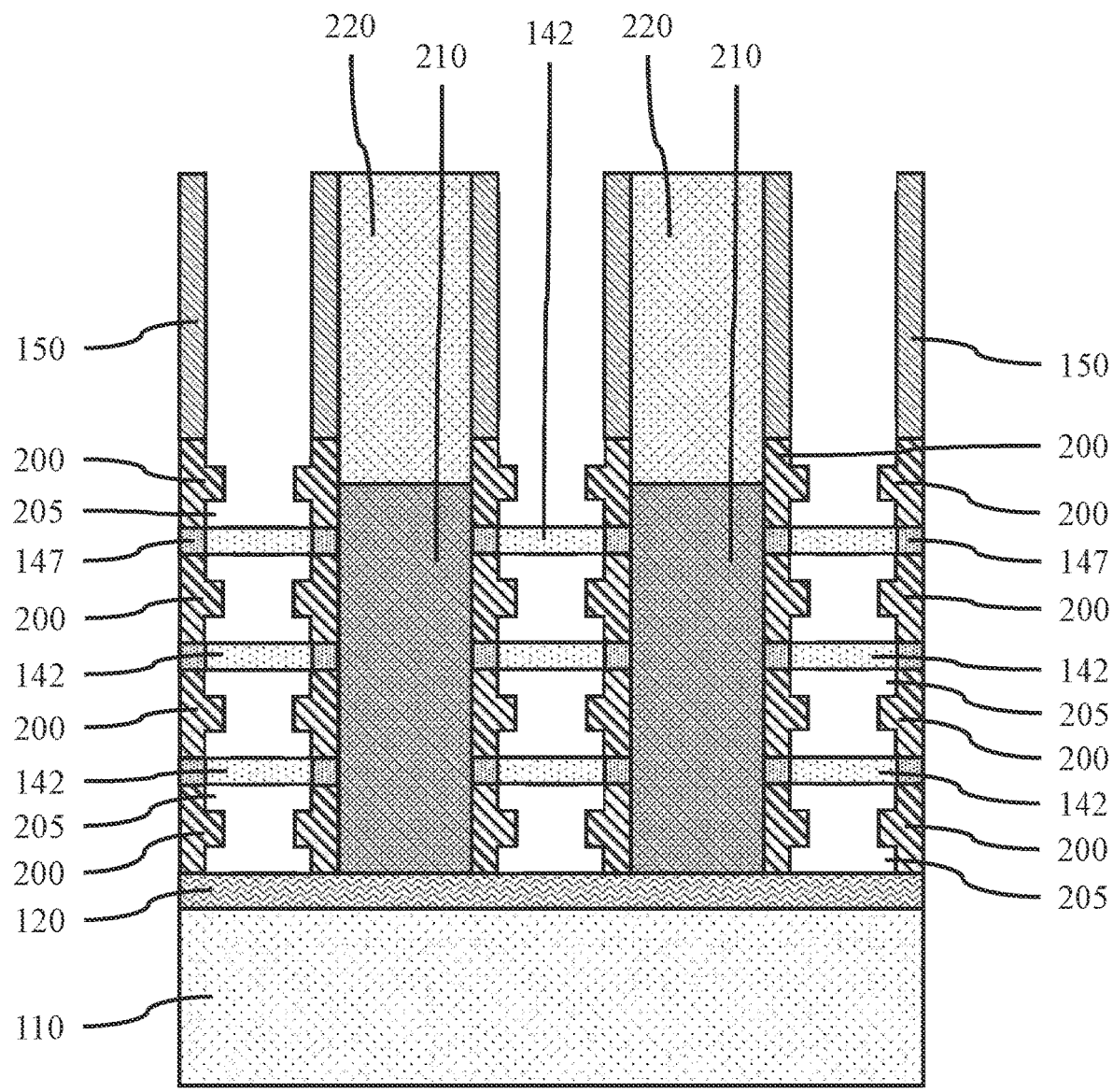
FIG. 13 is a cross-sectional side view showing removal of the inner spacer templates to expose the semiconductor nanosheet segments and T-shaped inner spacers, in accordance with an embodiment of the present invention.

FIG. 13 is a cross-sectional side view showing removal of the inner spacer templates to expose the semiconductor nanosheet segments and T-shaped inner spacers, in accordance with an embodiment of the present invention.

In one or more embodiments, the inner spacer templates 197 can be removed using a selective isotropic etch (e.g., wet chemical etch, dry plasma etch) to expose the inner spacers 200 and semiconductor nanosheet segments 142. Removal of the inner spacer templates 197 can expose cavities 205 formed by the inner spacers 200 and semiconductor nanosheet segments 142, where the "T" shape (cross-section) of the inner spacers 200 and the surface of the semiconductor nanosheet segments 142 or bottom isolation layer 120 creates the walls of the cavities 205. The "T" shape inner spacers 200 can wrap around the semiconductor nanosheet segments 142.

In various embodiments, the cavities 205 can have a depth in a range of about 2 nm to about 8 nm, although other depths are also contemplated.

Figure 14:
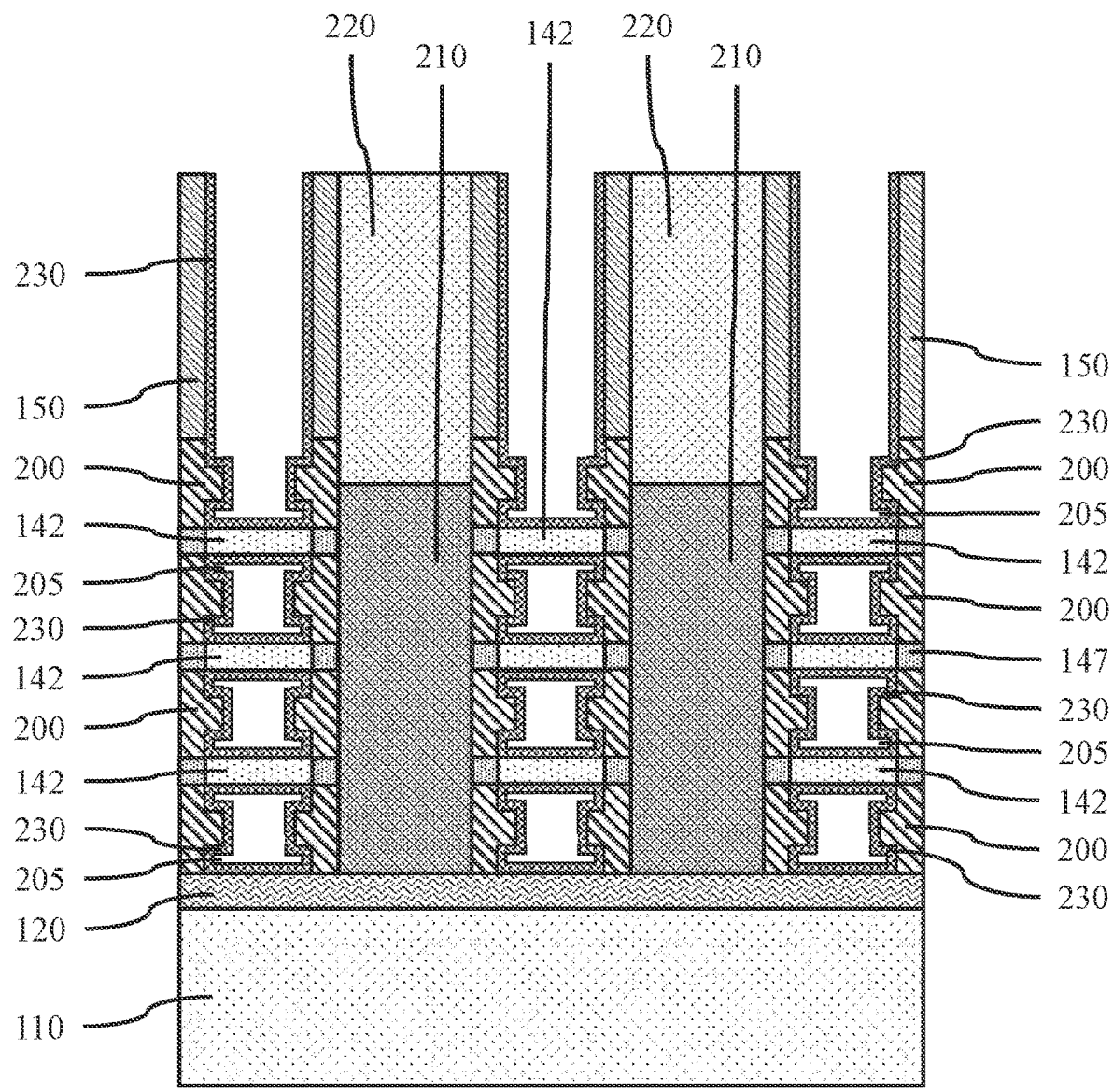
FIG. 14 is a cross-sectional side view showing formation of a gate dielectric layer on the dummy gate spacers, semiconductor nanosheet segments, and T-shaped inner spacers, in accordance with an embodiment of the present invention.

FIG. 14 is a cross-sectional side view showing formation of a gate dielectric layer on the dummy gate spacers, semiconductor nanosheet segments, and T-shaped inner spacers, in accordance with an embodiment of the present invention.

In one or more embodiments, a gate dielectric layer 230 can be formed on the dummy gate spacers 150, semiconductor nanosheet segments 142, and T-shaped inner spacers 200, where the gate dielectric layer 230 can be formed by a conformal deposition (e.g., ALD, PEALD).

In various embodiments, the gate dielectric layer 230 can be a high-k dielectric material, including, but not limited to, hafnium oxide ($HfO_2$), zirconium oxide ($ZrO_2$), hafnium lanthanum oxide ($HfLaO_x$), and combinations thereof.

Figure 15:
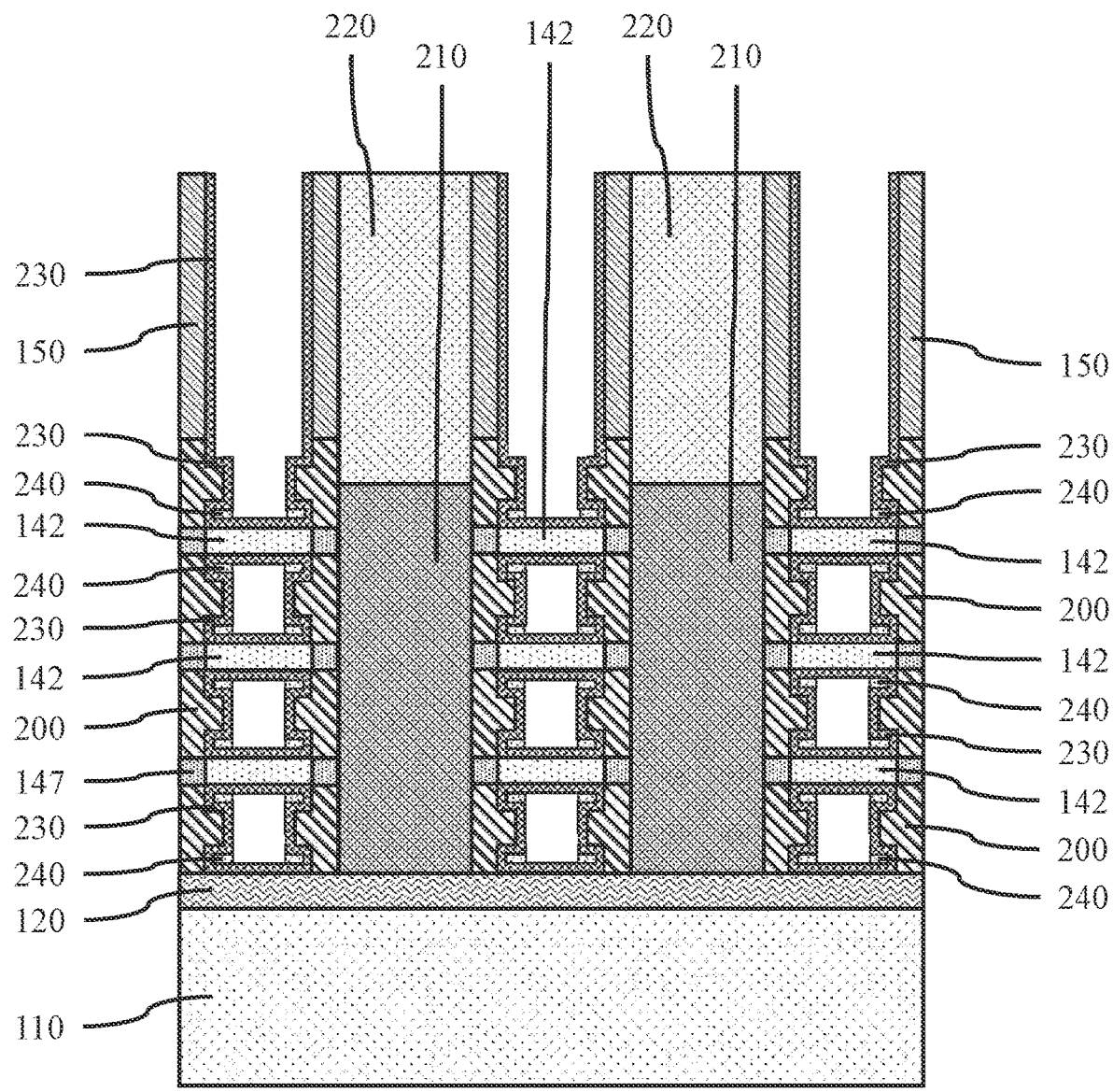
FIG. 15 is a cross-sectional side view showing formation of a first work function material plug in the cavities formed by the T-shaped inner spacers, semiconductor nanosheet segments, and gate dielectric layer, in accordance with an embodiment of the present invention.

FIG. 15 is a cross-sectional side view showing formation of a first work function material plug in the cavities formed by the T-shaped inner spacers, semiconductor nanosheet segments, and gate dielectric layer, in accordance with an embodiment of the present invention.

In one or more embodiments, a first work function material plug 240 can be formed in each of the cavities created by the T-shaped inner spacers 200, where the first work function material 240 can fill in the space remaining after forming the gate dielectric layer 230. The first work function material plugs 240 can be formed using a conformal deposition, and portions of the first work function material outside of the cavities can be removed using a selective etch.

In various embodiments, the first work function material plugs 240 for an n-type device (i.e., NFET) are a multi-layer combination of titanium nitride (TiN) having a first thickness (T1), an aluminum containing alloy, and another layer of titanium nitride (TiN (T1)/Al alloy/TiN). The aluminum containing alloy can be, for example, titanium-aluminum (TiAl), titanium-aluminum carbide (TiAlC), and combinations thereof. The thickness, T1, of the TiN can be in a range of about 0.5 nanometers (nm) to about 1.5 nm, although other thicknesses are contemplated. The thickness can determine the work function value.

In various embodiments, the first work function material plugs 240 for a p-type device (i.e., PFET) is titanium nitride (TiN).

Figure 16:
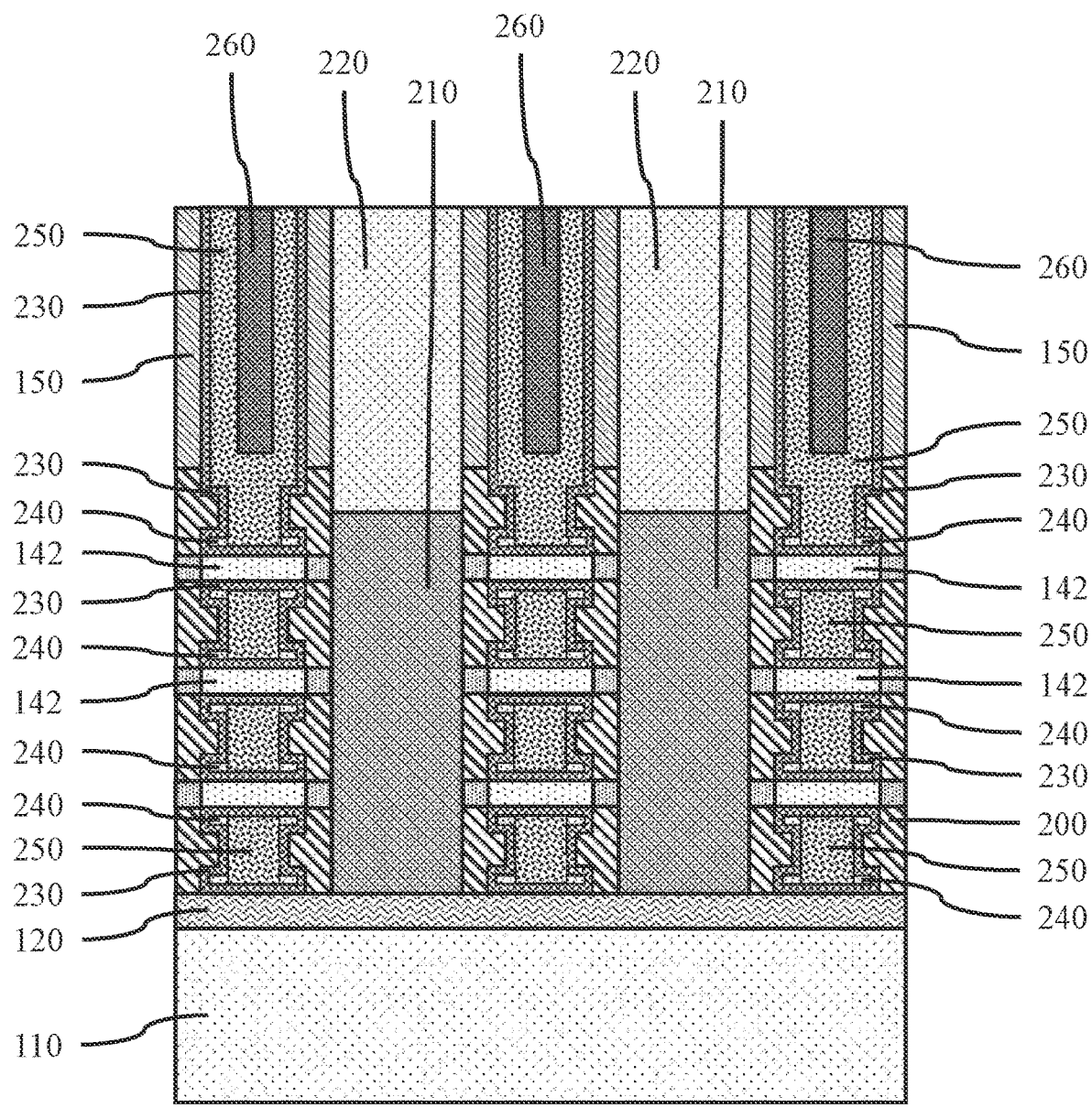
FIG. 16 is a cross-sectional side view showing formation of a second work function material layer on the first work function material plugs and gate dielectric layer, and a conductive gate fill in the second work function material layer, in accordance with an embodiment of the present invention.

FIG. 16 is a cross-sectional side view showing formation of a second work function material layer on the first work function material plugs and gate dielectric layer, and a conductive gate fill in the second work function material layer, in accordance with an embodiment of the present invention.

In one or more embodiments, a second work function material layer 250 can be formed on the first work function material plugs 240 and gate dielectric layer 230, where the second work function material layer 250 can be formed by a conformal deposition (e.g., ALD, PEALD). The second work function material layer 250 can be on the center portion of the semiconductor nanosheet segments 142 between the first work function material plugs 240.

In various embodiments, the second work function material layer 250 for an n-type device (i.e., NFET) is a multi-layer combination of titanium nitride (TiN) having a second thickness (T2), an aluminum containing alloy layer, and a titanium nitride layer (TiN (T2)/Al alloy/TiN). The thickness, T2, of the TiN can be in a range of about 1.5 nanometers (nm) to about 3.0 nm, although other thicknesses are contemplated. Changes in the titanium nitride thickness can shift the work function for the gate. In various embodiments, the thickness, T2, of the TiN is greater than the thickness, T1, of the TiN.

In various embodiments, the second work function material layer 250 for a p-type device (i.e., PFET) is a multi-layer titanium nitride (TiN) having a third thickness (T3)/an aluminum containing alloy/titanium nitride. The thickness, T3, of the TiN can be in a range of about 3.0 nanometers (nm) to about 5.0 nm, although other thicknesses are contemplated. In each instance of the thicknesses, T1<T2<T3. The thicknesses can determine the work function value.

This combination of work function materials provides appropriate NFET and PFET threshold voltages as well as reduced oxide field near the bottom drain, and reduced GIDL.

In various embodiments, the second work function material layer 250 and the first work function material plug 240 forms a gate all around structure on the semiconductor nanosheet segments 142. The first work function material plugs 240 are adjacent to the ends of the semiconductor nanosheet segments 142 and the second work function material layer 250 is over the center portion of the semiconductor nanosheet segments 142, where the first work function material plugs 240 are closer to the source/drain epitaxy 210. There is no overlap between the source/drain epitaxy 210 and the first work function material plugs 240. This reduces the parasitic capacitance.

In one or more embodiments, a conductive gate fill 260 can be formed on the second work function material layer, where the conductive gate fill 260 can be formed by a conformal deposition.

In various embodiments, the conductive gate fill 260 can be a conductive metal, including, but not limited to, tungsten (W), cobalt (Co), molybdenum (Mo), ruthenium (Ru), and combinations thereof.

In various embodiments, a chemical-mechanical polishing (CMP) can be used to removed excess material from the top surface and provide a flat, uniform surface.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not ntended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative: terms are intended to encompass different orientations of the device in use or operation in addition he orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it be the only layer between the two layers, or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect device, comprising:
a semiconductor nanosheet segment above a substrate;
a T-shaped inner spacer on the semiconductor nanosheet segment;
a gate dielectric layer on the semiconductor nanosheet segment;
a first work function material plug on the gate dielectric layer; and
a second work function material layer on the first work function material plug and a center portion of the gate dielectric layer, wherein the second work function material layer is a different work function material from the first work function material plug.

2. The field effect device of claim 1, wherein the first work function material plug is a multi-layer combination of titanium nitride (TiN) having a first thickness (T1), an aluminum containing alloy, and another layer of titanium nitride (TiN (T1)/Al alloy/TiN).

3. The field effect device of claim 2, wherein the second work function material layer is a multi-layer combination different from the multi-layer combination of the first work function material plug, including titanium nitride (TiN) having a second thickness (T2), an aluminum containing alloy layer, and a titanium nitride layer (TiN (T2)/Al alloy/TiN), where T2 is greater than T1.

4. The field effect device of claim 3, further comprising a source/drain epitaxy adjoining the semiconductor nanosheet segment.

5. The field effect device of claim 4, further comprising a bottom isolation layer separating the source/drain epitaxy from the substrate.

6. The field effect device of claim 5, wherein the titanium nitride layer of the first work function material plug has a first thickness (T1) in a range of about 0.5 nm to about 1.5 nm.

7. The field effect device of claim 6, wherein the titanium nitride layer of the second work function material layer has a second thickness (T2) in a range of about 1.5 nm to about 3.0 nm.

8. The field effect device of claim 7, wherein the second work function material layer and the first work function material plug forms a gate-all-around structure on the semiconductor nanosheet segment.

9. A field effect device, comprising:
a bottom isolation layer on a substrate;
a stack of semiconductor nanosheet segments over the bottom isolation layer;
a T-shaped inner spacer between each of the semiconductor nanosheet segments;
a gate dielectric layer on the T-shaped inner spacers and the semiconductor nanosheet segments;
a first work function material plug on the gate dielectric layer;
a second work function material layer on the first work function material plug and a center portion of the gate dielectric layer, wherein the second work function material layer is a different work function material from the first work function material plug; and
a source/drain epitaxy adjoining each of the semiconductor nanosheet segments, wherein the T-shaped inner spacers separate the first work function material plug from the source/drain epitaxy.

10. The field effect device of claim 9, wherein the first work function material plug is a multi-layer combination of titanium nitride (TiN) having a first thickness (T1), an aluminum containing alloy, and another layer of titanium nitride (TiN (T1)/Al alloy/TiN).

11. The field effect device of claim 10, wherein the second work function material layer is a multi-layer combination different from the multi-layer combination of the first work function material plug, including titanium nitride (TiN) having a second thickness (T2), an aluminum containing alloy layer, and a titanium nitride layer (TiN (T2)/Al alloy/TiN), where T2 is greater than T1.

12. The field effect device of claim 11, wherein the second work function material layer and the first work function material plug forms a gate all around structure on each of the semiconductor nanosheet segments.

13. The field effect device of claim 12, wherein the titanium nitride layer of the first work function material plug has a first thickness (T1) in a range of about 0.5 nm to about 1.5 nm.

14. The field effect device of claim 13, wherein the titanium nitride layer of the second work function material layer has a second thickness (T2) in a range of about 1.5 nm to about 3.0 nm.

15. A method of forming a field effect device, comprising:
forming a stack of alternating semiconductor nanosheet segments and sacrificial nanosheet sections on a substrate;
removing a portion of the sacrificial nanosheet sections to form a sacrificial slab between each adjacent pair of semiconductor nanosheet segments;
forming an inner spacer template on opposite sides of each sacrificial slab;
forming an inner spacer on each inner spacer template;
removing the sacrificial slabs and inner spacer templates; and
forming a first work function material plug in each cavity formed by the inner spacers and the semiconductor nanosheet segments.

16. The method of claim 15, further comprising forming a second work function material layer on the first work function material plug and a gate dielectric layer, wherein the second work function material layer is a different work function material from the first work function material plug.

17. The method of claim 16, further comprising forming a source/drain epitaxy adjoining each of the semiconductor nanosheet segments, wherein the inner spacers separate the first work function material plugs from the source/drain epitaxy.

18. The method of claim 17, further comprising forming a bottom isolation layer on the substrate, wherein the bottom isolation layer separates the source/drain epitaxy and the second work function material layer from the substrate.

19. The method of claim 18, wherein the first work function material plugs are a multi-layer combination of titanium nitride (TiN) having a first thickness (T1), an aluminum containing alloy, and another layer of titanium nitride (TiN (T1)/Al alloy/TiN).

20. The method of claim 19, wherein the second work function material layer is a multi-layer combination different from the multi-layer combination of the first work function material plugs, including titanium nitride (TiN) having a second thickness (T2), an aluminum containing alloy layer, and a titanium nitride layer (TiN (T2)/Al alloy/TiN), where T2 is greater than T1.

* * * * *